(12) United States Patent
Meuris et al.

(10) Patent No.: US 6,472,294 B2
(45) Date of Patent: Oct. 29, 2002

(54) SEMICONDUCTOR PROCESSING METHOD FOR PROCESSING DISCRETE PIECES OF SUBSTRATE TO FORM ELECTRONIC DEVICES

(75) Inventors: Marc Meuris, Keerbergen; Marc Heyns, Linden; Paul Mertens, Haacht, all of (BE)

(73) Assignee: IMEC vzw (BE)

( * ) Notice: Subject to any disclaimer, the term of this patent is extended or adjusted under 35 U.S.C. 154(b) by 0 days.

(21) Appl. No.: 09/933,495

(22) Filed: Aug. 20, 2001

(65) Prior Publication Data

US 2001/0055857 A1 Dec. 27, 2001

Related U.S. Application Data

(62) Division of application No. 09/363,975, filed on Jul. 29, 1999, now Pat. No. 6,322,598.

(30) Foreign Application Priority Data

Jul. 30, 1998 (EP) .......................... 982025645

(51) Int. Cl.[7] .............................. H01L 21/70
(52) U.S. Cl. ...................... 438/458; 438/459
(58) Field of Search ................. 438/458, 459, 438/464, 113, 404, 405; 29/25.01, 287, 289, 309

(56) References Cited

U.S. PATENT DOCUMENTS 3,419,955 A * 1/1969 Schuetze et al. .............. 29/577

| | | |
|---|---|---|
| 3,708,851 A | 1/1973 | Vladik |
| 4,711,014 A | 12/1987 | Althouse |
| 4,810,616 A | 3/1989 | Grabbe et al. |
| 5,256,204 A | 10/1993 | Wu |
| 5,349,207 A | 9/1994 | Malhi |
| 5,795,356 A | 8/1998 | Leveen |
| 5,899,730 A * | 5/1999 | Freund et al. .............. 438/464 |

OTHER PUBLICATIONS

Hattori, Takeshi; "Ultra–Clean Surface Processing of Silicon Wafers," Springer Verlag, 1998.

Sze, S.M.; "VLSI Technology," McGraw Hill Series in Electrical Engineering (second edition), 1988.

* cited by examiner

Primary Examiner—Olik Chaudhuri
Assistant Examiner—Stephen W. Smoot
(74) Attorney, Agent, or Firm—Knobbe Martens Olson & Bear LLP

(57) ABSTRACT

A semiconductor processing system for the production of semiconductor electronic devices is described, which includes a sequence of semiconductor processing steps carried out on a plurality of semiconductor processing machines, whereby the processing is carried out on discrete pieces of substrate which are smaller than conventional semiconductor wafers but may be made therefrom, or from larger diameter semiconducting wafers or from materials onto which semiconductor layers may be formed, and the discrete substrate pieces are selectably processable into the electronic devices either individually or as a plurality removably fixed to a support.

15 Claims, 5 Drawing Sheets

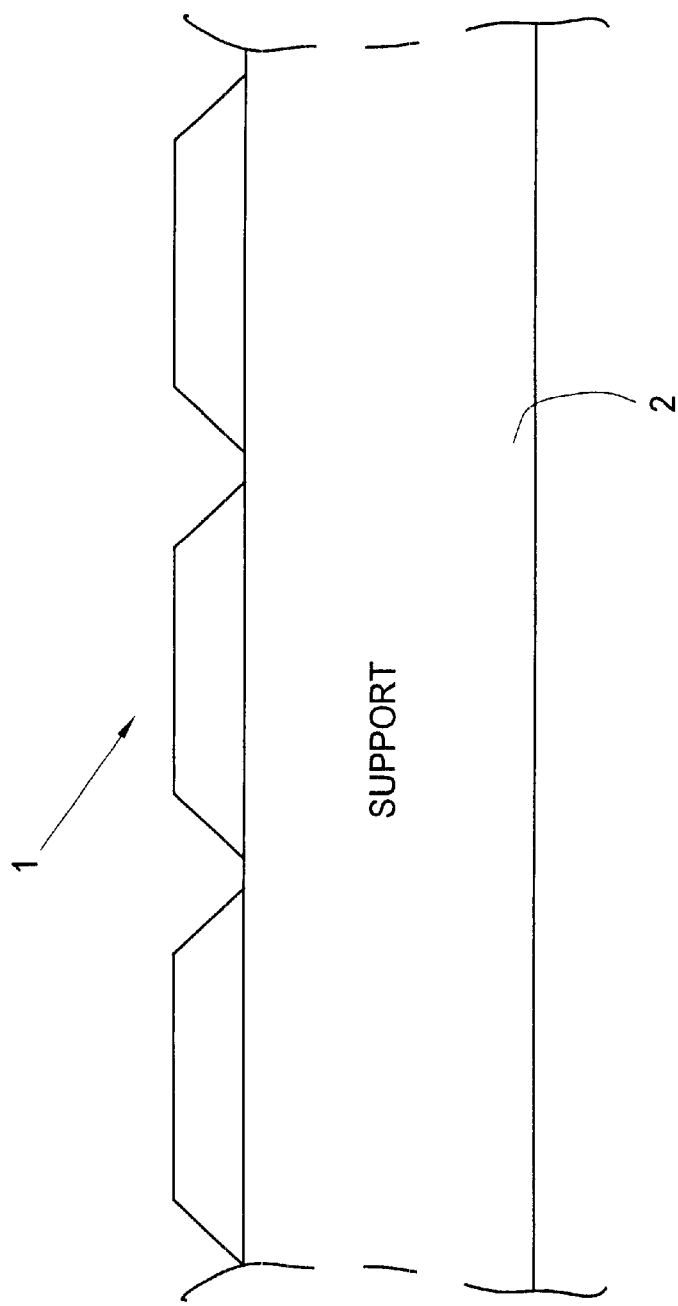

SEMICONDUCTOR PROCESSING METHOD FOR PROCESSING DISCRETE PIECES OF SUBSTRATE TO FORM ELECTRONIC DEVICES

RELATED APPLICATION

This application claims priority to and is a divisional of U.S. application Ser. No. 09/363,975, entitled SEMICONDUCTOR PROCESSING SYSTEM FOR PROCESSING DISCRETE PIECES OF SUBSTRATE TO FORM ELECTRONIC DEVICES, filed on Jul. 29, 1999, now U.S. Pat No. 6,322,598, which is hereby incorporated by reference.

FIELD OF THE INVENTION

The present invention relates to the processing of semiconductor substrates, in particular how to prepare semiconductor wafers for processing. The present invention particularly relates to the manufacture of integrated circuits, for example as a "chip".

BACKGROUND OF THE INVENTION

Silicon wafer sizes used in the semiconductor industry are nowadays 100 mm in diameter minimum. The conversion of the present semiconductor industry from 200 mm to 300 mm diameter silicon wafers is a new challenge for chip manufacturers. The main motivation for the conversion to larger wafer sizes is the fact that more chips may be produced using the same effort in skilled manpower and resources. A possible reduction in cost per function (by technology improvements or by reduction of manufacturing costs) is a basic driving force for the microelectronics industry. Currently, reduction of costs can be obtained by increased equipment productivity, reduction in start-up time of fabs, reduction in queue time and using cost of ownership principles. Increasing the wafer size, may well have a negative impact on these possible cost reductions. When changing the wafer size, most effort and money will be spent on making sure the wafer is processed uniformly, to keep the throughput of chips high. Less money is available for secondary equipment and manufacturing improvements. However, lithographic steps are the most expensive steps in IC manufacturing. The throughput of this step determines the overall throughput of the IC manufacturing line and manufacturing cost.

U.S. Pat. No. 4,810,616 describes a work holder for holding a plurality of ceramic pieces. Each ceramic piece may be used for holding one integrated circuit. The holder is designed so that conductive wiring may be applied to the ceramic pieces. Each ceramic piece is held in place by a metallic spring. The work holder may also be made of metal. This type of work holder and piece fixing method cannot be used in the processing of integrated circuits and is remote from the present invention. The known holder would generate considerable amounts of contamination in the finished IC's through contact diffusion from the metal spring and/or work holder into the active devices of the IC when carrying out a thermal treatment step at 450° C. or above, e.g. during CVD deposition of dielectrics, annealing after implant of doping, epitaxy deposition of layers, silicidation, oxidation, nitridation. At least one of these processes is essential in the manufacture of an IC. Information about contamination and how to prevent it may be obtained from "Ultra-clean surface processing of silicon wafers," by Takeshi Hattori, Springer Verlag, 1998.

The object of the invention is to present a new basic concept for chip manufacturing which provides an answer to the current economic challenges for chip manufacturers.

It is a further object of the present invention to provide a method and apparatus for manufacturing integrated circuits which are more economic and more easily optimized.

SUMMARY OF THE INVENTION

The present invention includes a semiconductor processing system for the production of semiconductor electronic devices, which includes a sequence of semiconductor processing steps carried out on a plurality of semiconductor processing machines, whereby the processing is carried out on discrete pieces of semiconductor substrate which are smaller than the conventional diameter of semiconductor wafers but may be made therefrom, or from larger wafers or from materials onto which semiconductor layers may be formed, and the discrete substrate pieces are selectably processable into the electronic devices either individually or as a plurality, wherein at least one of the semiconductor processing steps comprises a thermal treatment step at a temperature of 450° C. or above in which diffusing contamination is a critical factor with respect to the quality of the electronic devices produced, and the discrete substrate pieces are fixed to a support suitable for the above thermal treatment step, the discrete substrate pieces being separable from each other after processing. The relevant contamination may include organic or inorganic contamination in the form of any of particle contamination, gaseous contamination or solid contact contamination (diffusion contamination from contact with solids such as metals). The thermal treatment step may be one of the non-limiting list of: CVD deposition of dielectrics, annealing after implant of doping, epitaxy deposition of layers, silicidation, oxidation, nitridation. The discrete pieces as fixed to the support are preferably arranged in an a planar array. The discrete pieces are preferably polygonal in shape. The discrete pieces are preferably fixed to the support in such a way that they are surrounded by a substantially uniform thermal environment. Particularly preferred are fixing methods on which the complete surface of each discrete piece is in contact with a flat surface of the support. Also preferred are fixing methods in which at least a central area of the discrete piece is surrounded by a uniform thermal environment. In particular, it is preferred if the thermal resistance per unit area between at least the central area of each discrete piece and the support is substantially constant. The discrete pieces are preferably fixed to the support before loading into a processing machine and the discrete pieces are loaded and unloaded from at least one processing machine while being fixed to the support. The details of the support are given below. Preferably, the processing machines are semiconductor wafer processing machines. The conventional wafer diameters are 100 mm or more. At least one of the processing machines includes a lithographic machine and the dimensions of the discrete pieces of substrate may be related to the field of view of the lithographic machine, preferably the same as or larger than the field of view of the lithographic machines, e.g. a multiple thereof, typically twice or four times. The size, of each discrete piece may be chosen so that there are 10 steps or less in the lithographic machine for each discrete piece. The separation of the final electronic devices may be done by removing the pieces from the support or by dicing the support to isolate each electronic device without necessarily removing each piece from its surrounding support.

The present invention also includes a method for making a plurality of integrated circuits each including an active device, comprising the steps of: providing a plurality of semiconductor substrate pieces with predetermined dimensions; seperably fixing the plurality of substrate pieces on a support; and subjecting the plurality of substrate parts on the support to at least one process step of a sequence of process steps for producing the integrated circuits, the at least one process step comprising a thermal treatment step at a temperature of 450° C. or above in which contamination is a critical factor with respect to the quality of the active devices produced. Some of the process steps for chip manufacturing are applied to the support with its pieces of substrate rather than to a conventional type of wafer. Typical processes may be one of the non-limiting list of: CVD deposition of dielectrics, annealing after implant of doping, epitaxy deposition of layers, silicidation, oxidation, nitridation. The relevant contamination may include organic or inorganic contamination in the form of any of particle contamination, gaseous contamination or solid contact contamination (diffusion contamination from contact with solids such as metals).

An embodiment of the present invention is that the part of substrate is cut from a silicon wafer as grown. An embodiment of the present invention is that the part of substrate is cut from a silicon wafer which is thinned before cutting. An embodiment of the present invention is that the predetermined dimensions of the part of substrate are equal to the chip size or a multiple thereof. An embodiment of the present invention is that the predetermined dimensions of the part of pieces substrate are determined by the field of view of the optical lithography tools used in chip manufacturing. An embodiment of the present invention is that the predetermined dimensions of the substrate pieces are determined such that the throughput of chips in the manufacturing process is optimized.

The present invention also includes a support for holding a plurality of discrete substrate parts to be processed into integrated circuits, comprising: a plurality of locations on the support, each for one discrete substrate part; and means holding each substrate part at each location, such that the surface of the substrate part projects from the surface of the support by a distance within a predetermined range, the holding means and the support being thermally and chemically compatible with the substrate parts and at least one processing step for manufacture of the integrated circuits, the at least one process step comprising a thermal treatment step at a temperature of 450° C. or above in which contamination is a critical factor with respect to the quality of the integrated circuits produced. The relevant contamination may include organic or inorganic contamination in the form of any of particle contamination, gaseous contamination or solid contact contamination (diffusion contamination from contact with solids such as metals). The material of the support is preferably compatible with all integrated circuit manufacturing steps. In the support, recesses may be provided into which fit the pieces of substrate. The positioning of the pieces of substrate is preferably such that these project from the support and the height of the surface of the pieces (defined with respect to the surface of the support) is within a predefined range. An embodiment of the present invention is that the material of the pieces of substrate and the material of the support are thermally compatible, thus chosen such that during the processing at elevated temperature (higher than 450° C.) only a minimal of thermal stress is placed on the pieces of substrate. An embodiment of the present invention is that the predefined range for the height of the surface of the pieces of substrate with respect to the surface of the support is determined by the planarization requirements for manufacturing integrated circuit. As such the range is determined by limitations imposed by polishing and the lithographic tools used in the manufacturing of integrated circuits. An embodiment of the present invention is that the fixing of the substrate pieces on the support is done by positioning the substrate pieces in individual recesses in the support and then depositing a layer on the support, thus restraining the substrate pieces and finally the layer is removed from the surface of that part of the substrate pieces in which the integrated circuit will be made. An embodiment of the present invention includes the fixing of the substrate pieces on the support by positioning the substrate pieces in individual ones of the recesses on the support and then melting at least a part of the border of the substrate pieces. An embodiment of the present invention is the fixing of the substrate pieces on the support by adhesive or cement. The separation of the final integrated circuits may be done by removing the pieces from the support or by dicing the support to isolate each electronic device without necessarily removing each piece from its surrounding support.

The dependent claims define individually further embodiments of the present invention. The present invention will now be described with reference to the following drawings.

BRIEF DESCRIPTION OF THE DRAWINGS

FIG. 10 is a schematic representation of another embodiment of a fixing method and arrangement of squates in accordance with the present invention.

DETAILED DESCRIPTION OF THE ILLUSTRATIVE EMBODIMENTS

Figure 1:
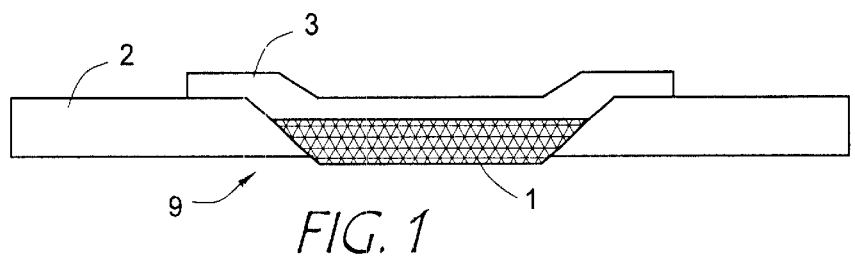
FIGS. 1 to 6 show schematic representations of different embodiments of supports in accordance with the present invention.

The present invention will be described with reference to certain embodiments and drawings but the invention is not limited thereto but only by the claims.

The present invention includes a semiconductor processing system for the production of semiconductor electronic devices which includes a sequence of semiconductor processing steps carried out on a plurality of semiconductor processing machines, whereby the processing is carried out on discrete pieces of substrate (called squates) which can be smaller than conventional 100 mm diameter semiconductor wafers but may be made therefrom, from larger size wafers or made from materials onto which semiconductor layers may be formed and then processed. The pieces of substrate may be selectably processed, either individually or as a plurality held on a support. The pieces of substrate may be polygonal in form, e.g. rectangular. The separation of the final electronic devices may be done by removing the pieces from the support or by dicing the support to isolate each electronic device without necessarily removing each piece from its surrounding support. This method allows bulk or batch processing of a plurality of substrate pieces on a support or a plurality of such supports when this makes sense, e.g. polishing, oxidation; or, alternatively, individual processing, e.g. for lithography, when bulk processing would introduce limitations, thus allowing the number of substrate pieces which are loaded simultaneously into each processing machine to be optimized for the highest throughput. At least one of the processing machines may include a lithography station. Preferably, the discrete pieces of substrate have dimensions related to the field of view of the lithographic machines, e.g. the same as the field of view or a multiple thereof. In particular, the dimensions of the pieces of substrate may be chosen so that 10 or less steps or indexing moves are made per piece in a lithographic tool. The dimensions of the support may be independent of the size of an individual piece of substrate but may be dependent upon other parameters of other processing machines, e.g. if the processing machines are wafer processing machines, the size of the supports may be the same as the wafer size so that only a minimum of modifications of a processing machine is necessary.

A squate is defined as a discrete piece of substrate suitable for the manufacture of at least one integrated circuit thereon. By an integrated circuit in accordance with the present invention is meant a fully developed electronic device including active and passive components or any structure which is an intermediate result of processing steps leading to such a fully developed device. An integrated circuit also includes a so-called "product-on-chip", i.e. an integrated circuit which is a self-contained module, e.g. for operating a mobile telephone. The squate may be made of, for instance, a piece of glass (for instance for silicon on glass processing or thin film transistor processing) or sapphire (for silicon on sapphire processing) or may be a portion of a semiconducting substrate (e.g. a part of silicon, germanium, silicon-germanium, gallium arsenide wafer) with predetermined dimensions (e.g. the size of a die or multiple dies). A plurality of squates may be removably fixed on a support. The squates are preferably arranged in a planar array with all their processable surfaces exposed and lying in one plane. By discrete substrate pieces is meant that there is not lattice continuity between the squate and its support. Some process steps for integrated circuit manufacturing may be applied to the support with its plurality of squates removably fixed thereto in a similar way to the processing of a wafer, alternatively, a single squate may be processed, or a mixture of the two types of processing may be included. Typical wafer processing steps such as wafer preparation, epitaxial growth of layers, oxidation, lithography, etching, dielectric or conductive film deposition, diffusion or ion implantation of dopants and metallisation, are described, for instance in "VLSI Technology", by S. M. Sze, McGraw Hill Series in Electrical Engineering. These processes may be applied to the squates on their support or individually to optimize throughput in accordance with the present invention. Conventionally a die is part of a wafer. Integrated circuits are processed on the dies. Conventionally, processing steps are done on the whole wafer with its dies. A squate is comparable with a die. The integrated circuit(s) is (are) processed on the squate. Where a plurality of squates are attached the support, the support with its squates may be used to load the squates into and unload the squates out of at least one semiconductor processing machine.

The basic advantage of this method of chip manufacture is that the semiconductor substrate cost is substantially independent of the dimensions of the support which can be made as big as required whereas the total cost of making the squates for one support is proportional to the number of squates on that support. This avoids the problem with conventional wafers that the increasing wafer size evolution in conventional chip manufacturing due to the increasing throughput demand results in a higher semiconductor substrate cost per unit area of die. In the present invention the support dimensions can be increased without increasing the per unit area substrate cost.

Throughput is defined as the amount of integrated circuits which can be processed per time unit. The present invention takes into account that the lithography step often determines the overall throughput of the IC manufacturing line. Hence, the dimensions of a squate are preferably determined by the size of the Field of View of the lithography tools used in chip manufacturing. The squates are removably fixed to the support, hence, the present invention enables a squate to be removed from the support and the squate may be individually handled for certain process steps which can result in higher throughputs. For instance, the stepping for optical or other types of lithography can become faster due to the weight reduction if squates are loaded individually (moving and alignment of only a single squate instead of a full wafer). In particular prealignment of the squates can be used particularly when there is one die on one squate. Alternatively, a plurality of squates may be lithographically processed when they are fixed to a support. Resist coatings may be applied on individual squates by conventional techniques such as spinning or capillary force application. The latter is preferred for squates as it reduces the quantity of resist used.

The chip manufacturing steps considered in the invention which may be carried out with a plurality of squates on a support may be, among others, dopant implantation, (rapid) thermal treatments in different ambients (e.g., oxygen, nitrogen gas), deposition of metals or insulating material by chemical vapor deposition, molecular beam epitaxy, physical vapor deposition (e.g., sputtering), electro- or electroless plating (e.g., for Cu), dry or wet, anisotropic or isotropic etching, cleaning and polishing (e.g., CMP), lithography. Use of a plurality of squates on a support is preferred when vacuum processes are involved as the pump down time can then be spread over several squates rather than for each individual squate. The present invention includes a process step while the squate is on the support which changes the internal structure of the active devices being formed on the squate, these active devices forming with other passive devices an electronic device on the squate. This requires at least some high temperature processing steps, e.g. processing steps with temperatures above 450° C. Changing the internal structure of an active device means that materials, substantially different from the original squate material, are inserted in or on the squate material or in or on a layer deposited on the squate and/or when already inserted, is moved from one place to another in the squate material or a layer on the squate material. Also removal of part of the original squate material or removal of part of a layer on the squate is understood as changing the internal structure. Methods of inserting materials can be out-diffusion by using different ambients/vapors or by using implantations. Moving material can be done by diffusion processes, typically requiring temperatures at least above 450° C. Removal of material can be done, for example, by oxidation and silicidation processes. Inserting and moving of material in the squate or in a layer on the squate and removal of part of the squate or a layer on the squate is expected to substantially modify the electrical properties of the squate and/or the layer thereon. Although packaging of chips (e.g., molding) is also done die per die, during packaging the internal structure of active devices is not modified. When one starts packaging the electronic devices are already created. Only low temperature steps (lower than 450° C.) are used. Further, although the integration of several modules also includes the use of a support on which chips are placed, the internal structure of the substrate is not modified by this integration process. The modules are fixed on the support by solder bumps or conductive glue. Only low temperature processing steps (lower than 450° C.) are used. Moreover, in the present invention the connection of the squates to the support does not have, primarily, the function of only completing conducting wiring.

A squate may have any shape, but is preferably polygonal, e.g. rectangular. A squate can be made, for instance, from a part of a silicon wafer substrate as grown or part of a silicon wafer which is thinned before it is cut into the squate sized pieces. Special wafer sizes could be produced to optimize squate cost, e.g. a single squate could be made from a wafer of about 50 mm diameter which would reduce manufacturing costs considerably. The squate size is typically the size of a die or multiple of the die size. The squate dimensions can also be defined to be in a range defined by the maximal Field of View of the lithographic tools or a multiple thereof, e.g. half the Field of View of the lithographic tools used for the chip manufacturing. A typical FoV is 26×33 mm. The edge exclusion of a squate is preferably smaller than the conventional edge exclusion for wafers, which is 3 mm. An edge exclusion of 1 mm is considered suitable for squates in accordance with the present invention.

In the present invention the squates may be removably fixed on a support or squate holder. The first embodiment of the holder 2 in accordance with the present invention is shown schematically in FIG. 1. Holder 2 includes a plurality of receiving spaces 9 which may be beveled or tapered holes into each of which a tapered or beveled piece 1 of substrate may be located. Holes 9 preferably have at least a portion of their inner walls at an angle which is similar to or the same as the angle on the edge of the piece 1 of substrate. The angle may be between 5 and 70° to the vertical, preferably, 10 to 15° when the edges of the squate and/or the recesses in the holder are machined. Where etching techniques are used the angle selected will be determined by the etching planes of the material, e.g. 54° for silicon. The dimensions of the piece 1 of substrate and the hole 9 are arranged so that when the piece 1 of substrate is located in the hole 9, one major surface of the piece 1 of substrate extends slightly beyond, the holder 2 which allows the piece 1 of substrate to be polished. In order to removably fix the piece 1 of substrate in hole 9, a layer 3 may be deposited, for example a silicon nitride layer on the reverse side of the support 2. Once the pieces 1 of substrate has been processed in order to form an integrated circuit, the layer 3 may be removed by etching or similar process and the piece 1 of substrate released from hole 9.

Figure 2:
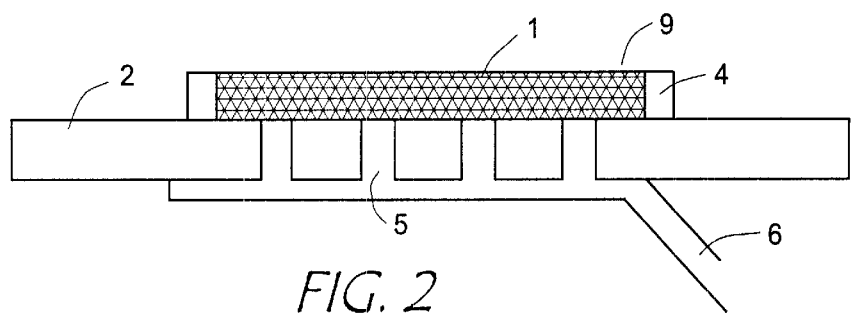

FIG. 2 is a schematic representation of a second embodiment of the holder 2 in accordance with the present invention. Holder 2 includes a plurality of receiving spaces 9, e.g. recesses into which a piece 1 of substrate may be placed. The dimensions of the recess 9 should be close to the dimensions of the piece 1 of substrate so that the piece 1 of substrate is well-located in the recess 9. Recess 9 may be formed in holder 2 or may be formed by raised walls 4 which are either integral with holder 2 or are attached to holder 2. In the base of recess 9, one or more fine holes 5 may be provided which are connected via conduit 6 to a vacuum pump. When the piece 1 of substrate is located in recess 9 and the vacuum applied, the piece 1 of substrate is firmly but removably held within the recess 9. This support 2 may be used for transporting large numbers of squates 1 between processing steps. The use of vacuum is less preferred in accordance with the present invention because the thermal environment of the squates 1 tends to be non-uniform especially in a central portion of the squate. In this region, the holes in the support which are used to extract gas provide a higher thermal resistance tan adjacent parts of the squates. In accordance with the present invention it is preferred if at least a central portion of each piece of substrate 1 has a relatively uniform thermal environment. This may mean that for each surface of the piece of substrate 1 the thermal resistance per unit area between the piece 1 and the support 2 is substantially uniform. The most preferred squate fixing methods are those in which the non-processed major surface of the squate 1 is in contact with a material of constant thickness.

Figure 3:
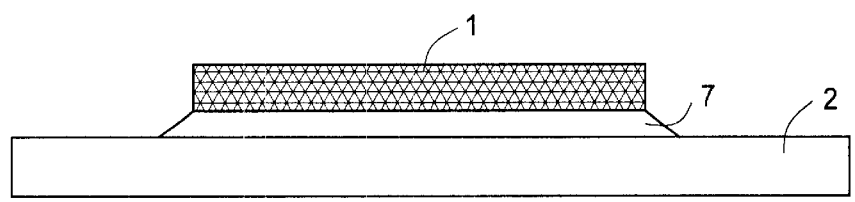

A third embodiment of the present invention is shown schematically in FIG. 3 in which a substrate piece 1 is removably fixed to holder 2 by means of an adhesive or cement layer 7. The cement or adhesive may provide good and uniform thermal contact with the support 2.

Figure 4:
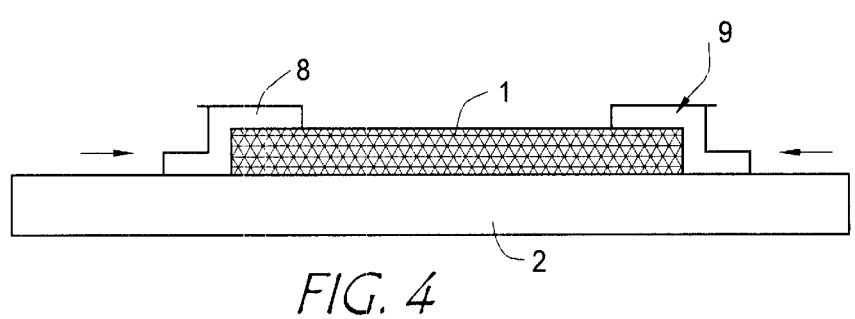

A fourth embodiment of the present invention is shown schematically in FIG. 4. Holder plate 2 is provided with a plurality of movable mechanical holding means 8, each defining a receiving space 9 when closed and each for holding a piece 1 of substrate. During processing the piece 1 of substrate is held in place by the movable mechanical means 8 which is released when it is necessary to release the piece 1 of substrate.

Figure 5:
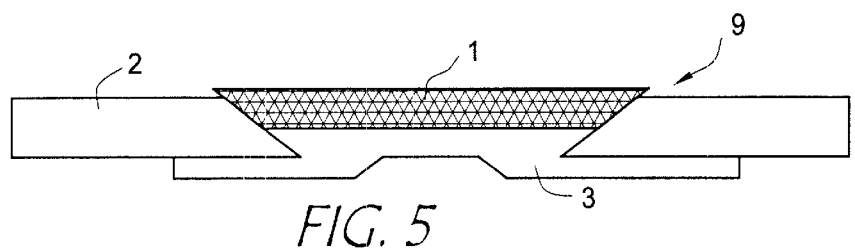

A fifth embodiment of the support 2 of the present invention is shown schematically in FIG. 5. In this support 2 receiving spaces 9, e.g. excavations or recesses are formed. Each recess 9 is preferably made so that a piece 1 of substrate can be placed partly therein. The bottom area of the piece 1 of substrate is smaller than the area of the recess 9 at the surface of the support 2. The piece 1 of substrate preferably projects above the surface of support 2 so that certain processes may be carried out conveniently, e.g. polishing. The distance between the surface of the piece 1 of substrate and the surface of the support 2 is preferably limited to that necessary for fulfilling the requirements for the lithographic tools. Thus, this height lies within a redefined range, defined by that required for planarization. The recess 9 may be blind or may be a hole through the support 2. The sides of the recess 9 and the sides of the piece 1 of the substrate may be at a suitable angle such as 5 to 25° to the vertical, preferably, 10 to 15°.

Figure 6A:
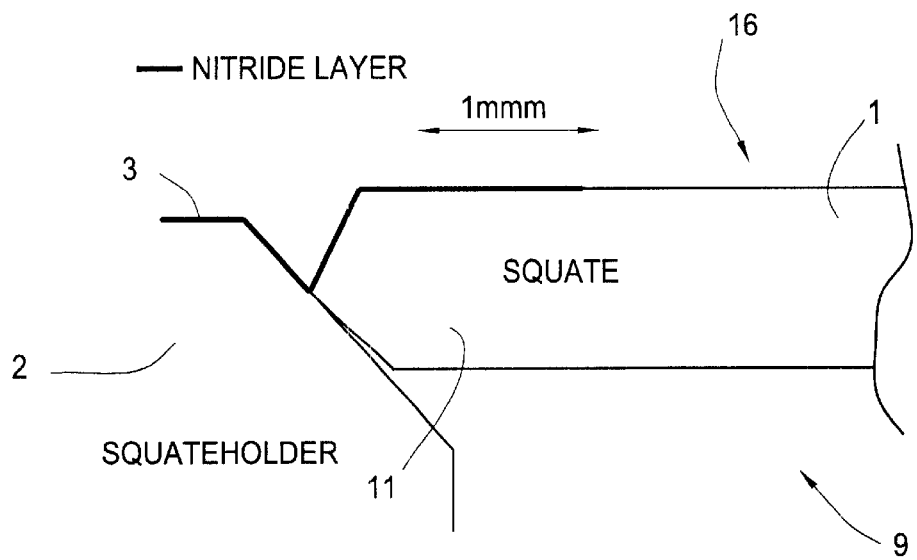
Figure 7:
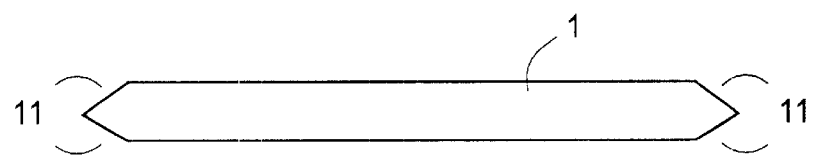
FIG. 7 is a schematic representation of a squate in cross-section in accordance with one embodiment of the present invention.

The squates 1 may be cut from a semiconductor, e.g. silicon wafers, which are made conventionally with or without including the final polish. After cutting, the squates 1 receive an edge finish and may appear in cross-section as shown in FIG. 7 including beveled edges 11 which may be used to locate the squate 1 in a receiving space 9 and which are part of the edge exclusion. The squates 1 are positioned into the recesses 9 of a squate holder 2. A layer 3 may be deposited on the bottom side (FIG. 5) or top side in order to fix the squate 1 on the squate holder 2. The layer 3 may be silicon nitride, for example. When layer 3 is on the top side it may be removed from part 16 of the surface of the squate 1 by etching (FIG. 6A). This can be done by an inexpensive exposure tool with low resolution and exposure range as large as the support 2. The layer 3 keeps the squates 1 fixed onto the holder 2 during processing and may be removed by etching or similar to free the squate 1.

Figure 6B:
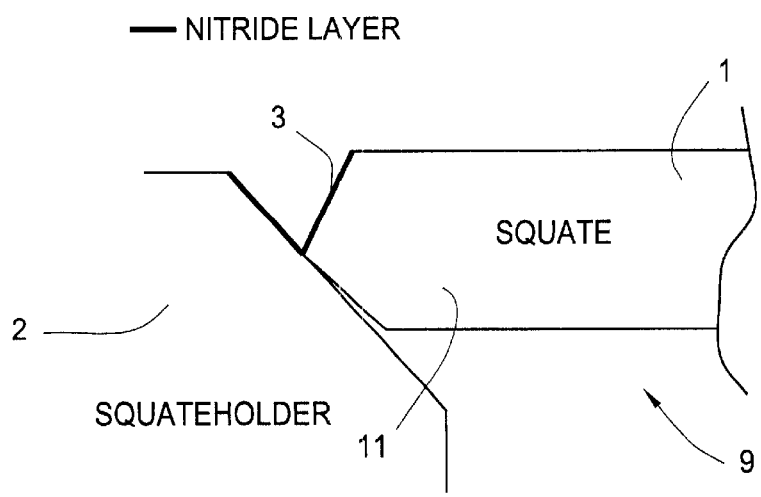

A sixth embodiment of the present invention will be described with reference to FIGS. 6B and 7 and includes squates 1 made from semiconductor wafers which are made conventionally without a final polish. These wafers are cut or diced into squates 1 which receive an edge finish as shown schematically in FIG. 7. Then the squates 1 are positioned into the recesses 9 of the squate holder 2 in accordance with the fifth embodiment. A holding layer 3 is deposited on the top side which may be silicon nitride. A mechanical or chemical and mechanical polishing process (e.g. CMP) is used to remove the top layer of the squates 1 (FIG. 6B), which also removes any height differences between the squates 1 and achieves a final polish for local planarization of the squates 1.

In accordance with a seventh embodiment of the present invention the squates 1 are positioned into the receiving spaces 9 of the squate holder 2 in accordance with the fifth embodiment and fixed by melting the edge of the squate 1 into or onto the squate holder material. This fixation can be done around the whole edge of the squate 1 or, for instance, only at one corner of the squate 1, depending on the thermal stability/stresses of the squate-squate holder contact zone. Melting can be done with a laser.

Other means of fixing the squates 1 in the receiving spaces 9 may be using adhesive or ceramic cement, which can withstand the high processing temperatures and which is removable.

For all the embodiments of the present invention mentioned above, the support 2 is preferably made of a material with thermal properties which are compatible with the thermal properties of the piece 1 of substrate used. The high temperature processing steps should not result in undue mechanical stress in the pieces 1 of substrate. The material of the support 2 is preferably sufficiently chemically inert and stable against the chemicals and the temperature used in integrated circuit processing. In particular, the holder 2 should not provide diffusion contamination at processing over 450° C. The following materials may be considered as suitable for support 2: quartz, semiconductor grade silicon, polysilicon, silicon carbide, silicon nitride, or a combination of these materials. The support 2 may be reuseable. The materials of the support 2 and the mean of fixing the pieces 1 to the support 2 should be compatible with high temperature processing steps, e.g. at least one thermal processing step at a temperature of 450° C. or higher. The compatibility also relates to not generating excessive amounts of contamination during the thermal processing step. Typical processes may be one of the non-limiting list of: CVD deposition of dielectrics, annealing after implant of doping, epitaxy deposition of layers, silicidation, oxidation, nitridation. The relevant contamination may include organic or inorganic contamination in the form of any of particle contamination, gaseous contamination or solid contact contamination (diffusion contamination from contact with solids such as metals).

Figure 8:
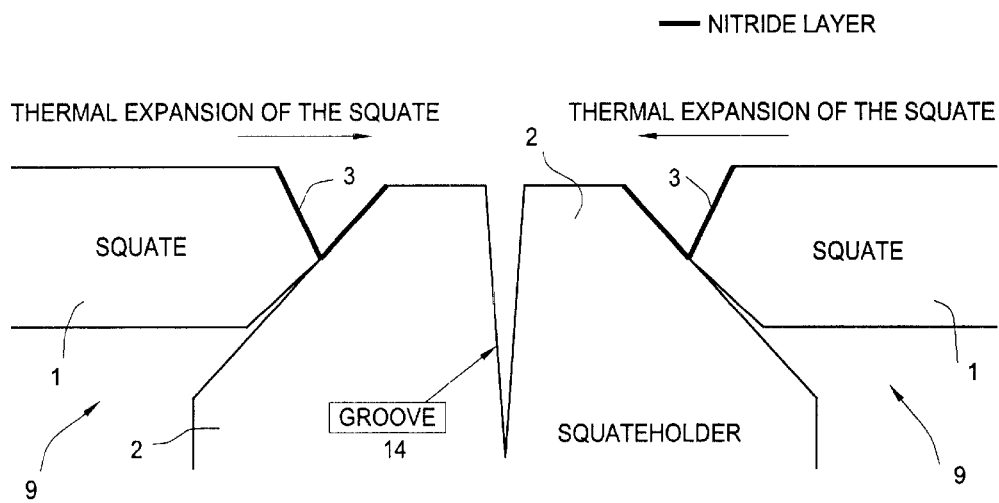
FIG. 8 is a schematic representation of another embodiment of a support in accordance with the present invention.

In accordance with a further embodiment of the present invention any of the above embodiments of the support 2 may be provided with grooves 14 between the squate receiving spaces 9 and fixing points to reduce thermal stresses in the squates 1 during high temperature processing steps as shown schematically in FIG. 8.

Figures 9A, 9B:
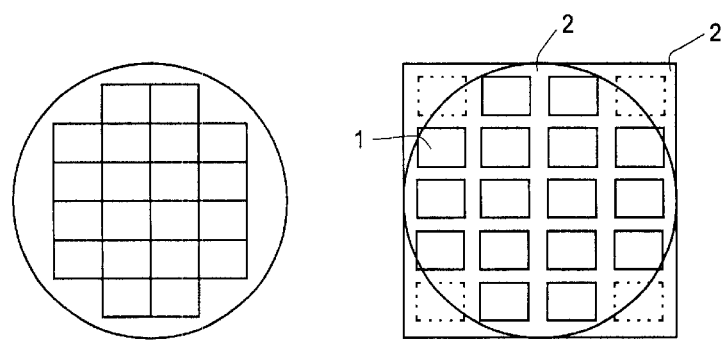
FIGS. 9A and 9B show, respectively, a conventional wafer with dies and a schematic representation of squates attached to a support in accordance with the present invention.

A general top view of a holder 2 (which may be square or circular as a shown) with a plurality of substrate pieces 1 already in place in their receiving spaces 9 is shown schematically in FIG. 9B with a comparison of conventional dies on a conventional wafer in FIG. 9A. The pieces of substrate 1 are fixed in the holder 2 in accordance with any of the above embodiments. The pieces 1 may be removed from the holder 2 after processing or the holder may be diced along lines between the pieces 1 thus separating the pieces a from each other. The top surface of the pieces of substrate 1 is raised above the general level of the upper surface of the holder 2 in order to make polishing processes such as chemical mechanical polishing (CMP) easy to perform. If the holder 2 is made square with a side width of 300 mm and a space between substrate pieces 1 is 5 mm and the squate size is 28×35 mm (active size of 26×33 mm) then the area of substrate 1 which is available for processing in holder 2 is approximately 98% compared with a complete 300 mm wafer. The thickness of the piece 1 of substrate may be for instance 200 micrometer or greater to provide sufficient mechanical strength. An edge exclusion of a squate is preferably 1 mm. The thickness of the holder may be about 1 mm.

A further embodiment of the present invention will be described with reference to FIG. 10. This is a schematic cross-section of a support 2 and pieces 1 of semiconductor substrate attached thereto. To manufacture pieces 1 a conventional silicon wafer of e.g. 100 or 150 mm as thin as e.g. between 30 and 200 $\mu$m is first provided. Then a masking layer (e.g. silicon oxide and/or nitride) is deposited and grooves are etched resulting in masking layer islands, each island covering an area of the wafer, e.g. in the form of a square of the size of a desired piece 1 of semiconducting material. Then a suitable etchant such as KOH is used to etch through the whole wafer thickness, separating the pieces 1 from each other. These pieces can 1 then be used to attach onto a support 2. To make a support 2, a suitable substrate (sheet) of material is provided e.g. a sheet of crystalline silicon or more preferably polysilicon (cheaper material than crystalline silicon), having a thickness of the order of 1 mm. The top surface of this substrate may be treated in such a way (e.g. by polishing or by depositing another material), that surface bonding becomes possible. The pieces 1 are made from monocrystalline silicon as described above and have the dimensions relating to the field of view of the lithographic process (or a multiple thereof). The thickness of the pieces 1 is preferable as thin a possible (for cost price reduction) while still retaining a certain mechanical strength, so that they can be handled and placed on top of the support 2. The underneath side of the pieces 1 is treated so that bonding of its surface with the support 2 is possible. This can be done by, for example, by polishing or depositing a suitable layer. The pieces 1 may be attached to a polished and cleaned support 2 by annealing, i.e. by a thermal treatment step which promotes van der Wahl's forces between the pieces 1 and flat regions of support 2. Instead of a bonding process to attach the monocrystalline piece 1 onto the support 2, a fixing means may be used e.g. a silicon oxide layer may be provided between the support 2 and the piece 1 and at least a part of this layer is melted to bond with the piece 1. The melting point and/or flow point of silicon oxide is below the melting point of silicon so that the piece 1 is not deformed or damaged. The advantage of this method is that the thickness of the monocrystalline material of the piece 1 can be made small, which lowers material cost. Preferably, the support thermal mass is larger than the thermal mass of the pieces 1, so that the pieces 1 can be heated uniformly and with a minimum of thermally induced mechanical stress.

In an alternative embodiment, a support 2 may be prepared by, for instance, depositing or growing a silicon oxide layer. Then island or stripes of, for instance, between 1 and 5 micron are made from these oxide. On these oxide islands or stripes the pieces 1 are bonded or molten onto the substrate. After the processing of the pieces 1 into integrated circuits, the surface of each piece 1 is covered with a material (e.g. silicon nitride) which can withstand the etching by a chemical etchant (e.g. HF). Then, this etchant (e.g. HF) is applied to selectively etch the oxide underneath each piece 1. Because capillaries are formed underneath the piece 1 by the use of the oxide stripes or islands, the etchant can be applied uniform underneath the whole piece 1 and a relative fast etching occurs, resulting in a short process time for separating the pieces 1 from the support 2.

Figure 11:
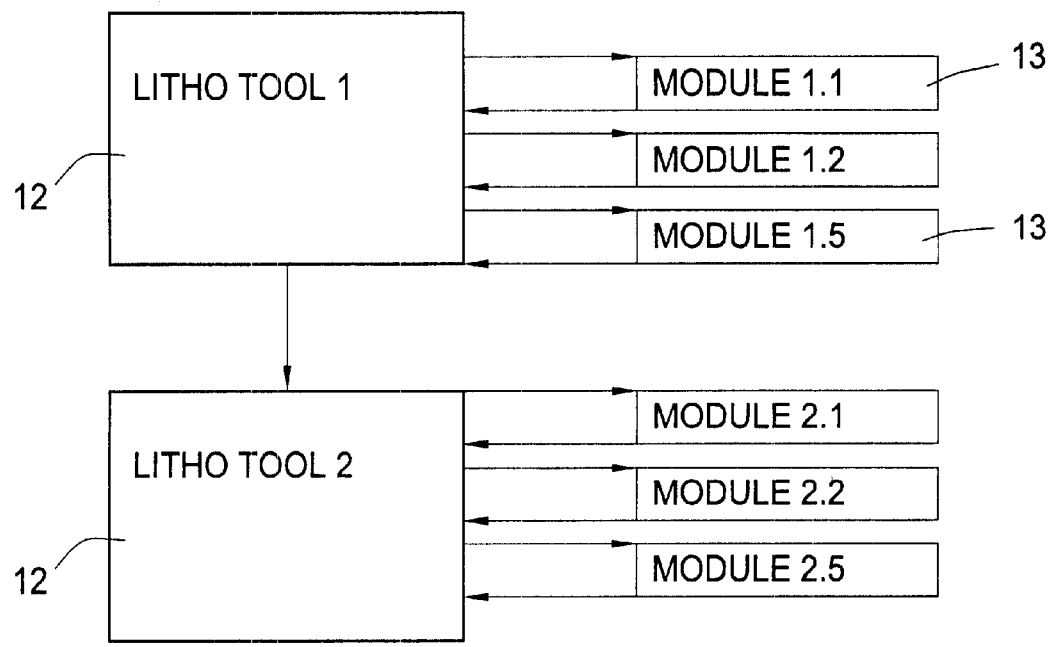
FIG. 11 is a schematic representation of a semiconductor processing system in accordance with the present invention.

The present invention includes a semiconductor processing system in which the squates 1 may be processed either on a support 2 as described above or individually, i.e. the squates 1 are removably held on the support 2 during some of the processes and them removed and treated individually for others. For example, the cycle time for lithography may be reduced if the squates 1 are processed individually through the lithography equipment as this reduces the time to align a single squate 1 compared with a complete wafer. Thus, the present invention includes a specially arranged lithography section in which the squates 1 are processed individually whereas in other processes they are processed on the most conveniently sized supports 2. It is preferred if the lithography tool (the most expensive equipment) will always be feed with product, every moment it is available for processing. This means that the idle time for lithography is reduced to a minimal value. The processing modules of the integrated circuit manufacturing process are divided at the start or at the end of a critical lithography step. Assuming that the other processing area tools in the modules are designed to proceed at a throughput of 1 squate per second, and the lithography tool has a throughput of 5 squates per second, then a manufacturing system in accordance with the present invention is shown schematically in FIG. 11 in which one lithography tool 12 is making the pattern for 5 process modules 13. Buffering capacity in between each module 13 and a large buffering capacity between each lithographic tool 12 will be preferable. The arrows of FIG. 11 represent the direction of the product flow and at each arrow, buffering capacity has to be foreseen to allow smooth processing through the lithography tool (the lithography tool should have a minimal idle time). In this way, a whole IC manufacturing line may be built with a few, e.g. 4 or 5 lithographic tools in total. By using different sizes of support 2 to accommodate different numbers of squates, it is possible to optimize the cycle times in the other processing steps in the manufacture of semiconductor integrated circuits in order to optimize the throughput with reference to the throughput limiting step which is presently lithography but the present invention is not limited thereto. The present invention also includes prealignment of supports 2. The exact position of the receiving spaces 9 can be measured for each support and recorded. This data is then used to drive processing machines, e.g. lithographic equipment, accurately to each squate position on a support 2 more quickly than by conventional techniques. This avoids individual processing of squates 1.

While the invention has been shown and described with reference to preferred embodiments, it will be understood by those skilled in the art that various changes or modifications in form and detail may be made without departing from the scope and spirit of this invention.

What is claimed is:

1. A method for producing a plurality of integrated circuits each including an active device, comprising:

providing a plurality of semiconductor substrate pieces with predetermined dimensions determined by the field of view of at least one lithography tool used in the sequence of processing steps;

separably fixing the plurality of substrate pieces on a support made of a material selected so as not to contaminate the plurality of substrate pieces during the production process; and subjecting the plurality of substrate pieces on the support to at least one process step of a sequence of process steps for producing the integrated circuits, the at least one process step comprising a thermal treatment step at a temperature of 450° C. or above.

2. The method according to claim 1, wherein the at least one processing step affects the internal structure of the active devices.

3. The method according to claim 1, wherein the at least one process is one of: CVD deposition of dielectrics, annealing after implant of doping, epitaxy deposition of layers, silicidation, oxidation, or nitridation, and wherein the relevant contamination may include organic or inorganic contamination in the form of any of particle contamination, gaseous contamination or solid contact contamination (diffusion contamination from contact with solids such as metals).

4. The method according to claim 1, wherein each substrate piece is part of a semiconductor wafer as grown or thinned.

5. The method according to claim 1, further comprising:

providing a support which has a plurality of receiving spaces such that the area of one major surface of the pieces of the substrate is smaller than a surface area of the receiving space, a border of the receiving spaces being such that the surface of the pieces of substrate project from the surface of the support by a distance within a predeterminied range; and positioning the pieces of the substrate in the receiving spaces of the support.

6. The method according to claim 5, further comprising:

depositing a layer on the support and the substrate pieces.

7. The method according to claim 6, further comprising:

removing the deposited layer from a portion of the surface of the substrate pieces.

8. The method according to claims 5, further comprising:

removably bonding the pieces of the substrate to the support by melting portions of borders of substrate pieces.

9. The method according to claim 5, further comprising: removably bonding the pieces of the substrate to the support using an adhesive or a cement.

removably bonding the pieces of the substrate to the support using an adhesive or a cement.

10. The method according to claim 5, further comprising:

removably bonding the pieces of the substrate to the support by annealing the pieces of the substrate to the support.

11. A method for producing a plurality of integrated circuits each including an active device, the method comprising:

providing a plurality of semi-conductor substrate pieces with predetermined dimensions;

separably fixing the plurality of substrate pieces on a support made of a material selected so as not to contaminate the plurality of substrate pieces during the production process, said support having a plurality of receiving spaces such that the area of one major surface of the pieces of the substrate is smaller than a surface area of the receiving space, a border of the receiving space is being such that the surface of the pieces of substrate project from the surface of the support by a distance within a predetermined range;

positioning the pieces of the substrate in the receiving spaces of the support;

depositing a layer on the support and the substrate pieces;

removing the deposited layer from a portion of the surface of the substrate pieces; and subjecting the plurality of substrate pieces on the support to at least one process step of a sequence of process steps for producing the integrated circuits, the at least one process step comprising a thermal treatment step at a temperature of 450° C. or above.

12. A method for producing a plurality of integrated circuits each including an active device, the method comprising:

providing a plurality of semiconductor substrate pieces with predetermined dimensions;

removably bonding the pieces of the substrate to a support made of a material selected so as not to contaminate the plurality of substrate pieces during the production process, the support having a plurality of receiving spaces such that the area of one major surface of the pieces of the substrate is smaller than the surface area of the receiving space, a border of the receiving spaces being such that the surface of the pieces of substrate project from the surface of the support by a distance within a predetermined range;

positioning the pieces of the substrate in the receiving spaces of the support; and subjecting the plurality of substrate pieces on the support to at least one process step of the sequence of process steps for producing the integrated circuits, the at least one process step comprising a thermal treatment step at a temperature of 450° C. or above.

13. The method of claim 12, further comprising removing the pieces of the substrate from the support.

14. A method for producing a plurality of integrated circuits each including an active device, the method comprising:

providing a plurality of semiconductor substrate pieces with predetermined dimensions;

removably bonding the pieces of the substrate to a support using an adhesive or a cement, the support being made of a material selected so as not to contaminate the plurality of substrate pieces during the production process, the support having a plurality of receiving spaces such that the area of one major surface of the pieces of the substrate is smaller than the surface area of the receiving space, a border of the receiving spaces being such that the surface of the pieces of substrate project from the surface of the support by a distance within a predetermined range;

positioning the pieces of the substrate in the receiving spaces of the support; and subjecting the plurality of substrate pieces on the support to at least one process step of the sequence of process steps for producing the integrated circuits, the at least one process step comprising a thermal treatment step at a temperature of 450° C. or above.

15. The method of claim 14, further comprising removing the pieces of the substrate from the support.

* * * * *

UNITED STATES PATENT AND TRADEMARK OFFICE
CERTIFICATE OF CORRECTION

PATENT NO.     : 6,472,294 B2
DATED          : October 29, 2002
INVENTOR(S)    : Meuris et al.

It is certified that error appears in the above-identified patent and that said Letters Patent is hereby corrected as shown below:

<u>Title page,</u>
Item [75], please correct the order of inventors as follows:
-- Marc Meuris, Keerbergen; Paul Mertens, Haacht; Marc Heyns, Linden, all of (BE). --

Signed and Sealed this

Twenty-seventh Day of May, 2003

JAMES E. ROGAN
*Director of the United States Patent and Trademark Office*